United States Patent
Zhang et al.

(10) Patent No.: US 11,201,263 B2
(45) Date of Patent: Dec. 14, 2021

(54) SURFACE ROUGHENING METHOD FOR LIGHT EMITTING DEVICE AND LIGHT EMITTING DEVICE

(71) Applicant: ENKRIS SEMICONDUCTOR, INC., Suzhou (CN)

(72) Inventors: Liyang Zhang, Suzhou (CN); Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 45 days.

(21) Appl. No.: 16/801,494

(22) Filed: Feb. 26, 2020

(65) Prior Publication Data
US 2020/0194622 A1     Jun. 18, 2020

Related U.S. Application Data

(63) Continuation of application No. PCT/CN2017/100851, filed on Sep. 7, 2017.

(51) Int. Cl.
*H01L 33/22* (2010.01)
*H01L 33/00* (2010.01)
(Continued)

(52) U.S. Cl.
CPC .......... *H01L 33/22* (2013.01); *H01L 33/0075* (2013.01); *H01L 33/06* (2013.01); *H01L 33/32* (2013.01)

(58) Field of Classification Search
CPC ..... H01L 33/0075; H01L 33/22; H01L 33/06; H01L 2933/0091; H01L 33/007; H01L 33/32

See application file for complete search history.

(56) References Cited

U.S. PATENT DOCUMENTS 6,939,730 B2 * 9/2005 Goto ................. C30B 25/02
                                              257/E21.108
7,071,494 B2 * 7/2006 Steigerwald ........... H01L 33/22
                                              257/98
(Continued)

FOREIGN PATENT DOCUMENTS

CN      105789401 A     7/2016
GN      102130223 B     7/2012
(Continued)

OTHER PUBLICATIONS

International Search Report in corresponding PCT Application No. PCT/CN2017/100851, dated Jun. 7, 2018.
(Continued)

*Primary Examiner* — Savitri Mulpuri
(74) *Attorney, Agent, or Firm* — Westbridge IP LLC

(57) ABSTRACT

A surface roughening method includes the following steps: preparing a first epitaxial layer of a three-dimensional island shape growth over a light emitting structure; and preparing a discontinuous second epitaxial layer over the first epitaxial layer. The surface roughening method provided in the present application is simple and convenient, and improves the efficiency. In addition to the epitaxial growth process, it is not necessary to use an additional process such as wet etching, photonic crystal and other processes to further process the surface of the epitaxial layer, and the method may be implemented by means of one process in a same reaction equipment.

16 Claims, 4 Drawing Sheets

(51) Int. Cl.
*H01L 33/06* (2010.01)
*H01L 33/32* (2010.01)

(56) References Cited

U.S. PATENT DOCUMENTS

| | | | | |
|---|---|---|---|---|
| 7,781,780 | B2* | 8/2010 | Lin | H01L 33/36 |
| | | | | 257/79 |
| 7,923,749 | B2* | 4/2011 | Yoo | H01L 21/02447 |
| | | | | 257/103 |
| 2002/0155682 | A1* | 10/2002 | Shibata | H01L 21/02458 |
| | | | | 438/478 |
| 2003/0119239 | A1* | 6/2003 | Koike | H01L 21/0237 |
| | | | | 438/200 |
| 2008/0283865 | A1 | 11/2008 | Yoo et al. | |
| 2010/0019263 | A1* | 1/2010 | Yeh | H01L 33/22 |
| | | | | 257/98 |
| 2010/0314642 | A1* | 12/2010 | Kudo | H01L 33/20 |
| | | | | 257/98 |
| 2011/0073894 | A1* | 3/2011 | Chu | H01L 33/22 |
| | | | | 257/98 |
| 2011/0156000 | A1 | 6/2011 | Cheng | |
| 2013/0082290 | A1* | 4/2013 | Yan | H01L 33/382 |
| | | | | 257/98 |
| 2014/0151715 | A1* | 6/2014 | Smirnov | H01L 33/0066 |
| | | | | 257/76 |
| 2017/0148945 | A1* | 5/2017 | Lee | H01L 33/20 |
| 2017/0338112 | A1* | 11/2017 | Iso | H01L 21/02576 |

FOREIGN PATENT DOCUMENTS

| | | |
|---|---|---|
| GN | 103765613 A | 4/2014 |
| JP | 2006190710 A | 7/2006 |

OTHER PUBLICATIONS

Written Opinion in corresponding PCT Application No. PCT/CN2017/100851, dated Jun. 7, 2018.

* cited by examiner

SURFACE ROUGHENING METHOD FOR LIGHT EMITTING DEVICE AND LIGHT EMITTING DEVICE

CROSS-REFERENCE TO RELATED APPLICATIONS

This application is a continuation of International Application No. PCT/CN2017/100851 filed on Sep. 7, 2017, the disclosure of which is hereby incorporated by reference in its entirety.

TECHNICAL FIELD

The present application relates to a semiconductor device and a method for manufacturing the same, in particular to a surface roughening method for a light emitting device and a light emitting device.

BACKGROUND

In recent years, semiconductor Light Emitting Diodes (LEDs) have attracted widespread attention. The semiconductor Light Emitting Diodes have the advantages of small volume, high efficiency, long life and so on. With the rapid development of wide band gap III-V semiconductor materials, the high brightness LEDs have been commercialized from green light to near ultraviolet products.

SUMMARY

The present application discloses a surface roughening method for a light emitting device, including the following steps: (a) preparing a first epitaxial layer of a three-dimensional island shape growth over a light emitting structure; and (b) preparing a discontinuous second epitaxial layer over the first epitaxial layer.

In an embodiment, the light emitting structure includes an n-type semiconductor layer, an active layer and a p-type semiconductor layer.

In an embodiment, the light emitting structure is made of a GaN-based material.

In an embodiment, a material of the first epitaxial layer is different from a material of the light emitting structure in direct contact with the first epitaxial layer, and a material of the second epitaxial layer is different from the material of the first epitaxial layer.

In an embodiment, a thickness of the first epitaxial layer is less than 50 nm.

In an embodiment, a thickness of the second epitaxial layer is less than a thickness of the first epitaxial layer.

In an embodiment, the step (a) and the step (b) are repeated a plurality of times sequentially.

In an embodiment, the step (a) and the step (b) are implemented by a metal organic chemical vapor deposition process.

In an embodiment, the first epitaxial layer is made of AlN, and the second epitaxial layer is made of GaN.

The present application also discloses a light emitting device, including: a light emitting structure; a first epitaxial layer of a three-dimensional island shape growth over the light emitting structure; and a discontinuous second epitaxial layer over the first epitaxial layer.

In an embodiment, the light emitting structure includes an n-type semiconductor layer, an active layer and a p-type semiconductor layer.

In an embodiment, the light emitting structure is made of a GaN-based material.

In an embodiment, a material of the first epitaxial layer is different from a material of the light emitting structure in direct contact with the first epitaxial layer, and a material of the second epitaxial layer is different from the material of the first epitaxial layer.

In an embodiment, a thickness of the first epitaxial layer is less than 50 nm.

In an embodiment, a thickness of the second epitaxial layer is less than a thickness of the first epitaxial layer.

In an embodiment, the first epitaxial layer and the second epitaxial layer are prepared repeatedly for a plurality of times.

In an embodiment, the first epitaxial layer is made of AlN, and the second epitaxial layer is made of GaN.

In the method and the light emitting device disclosed in this present application, in addition to the epitaxial growth process, it is not necessary to use an additional process such as wet etching, photonic crystal and other processes to further process the surface of the epitaxial layer, and the method may be implemented by means of one process in a same reaction equipment. The method is simple and convenient, improves the efficiency, and avoids the pollution caused by, for example, etching process to the epitaxial layer. In addition, the roughened surface formed in this way also has a certain improvement in the roughening effect compared with the traditional process, which may play a role in improving the light extraction efficiency of the LED structure.

BRIEF DESCRIPTION OF DRAWINGS

A description of the present application combined with embodiments and accompanying drawings is given below. In the accompanying drawings.

DETAILED DESCRIPTION OF THE EMBODIMENTS

Figure 1:
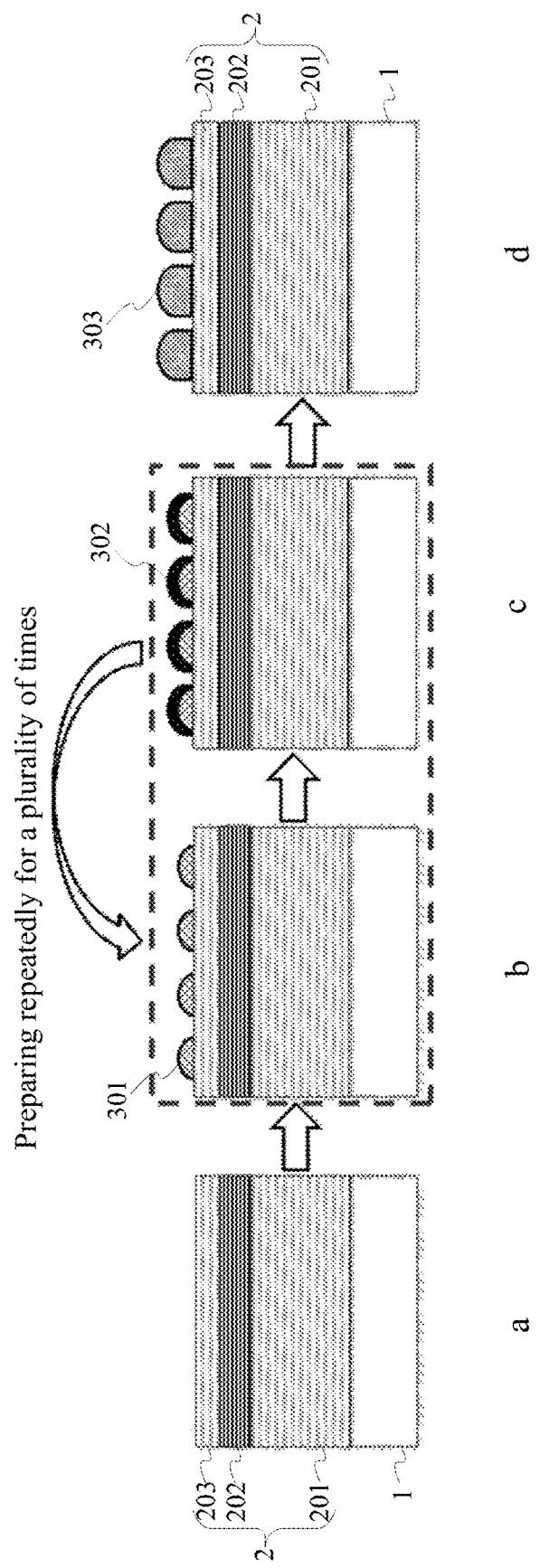
FIG. 1 is a schematic diagram of a surface roughening method according to an embodiment of the present application.

The accompanying drawings are only used for exemplary illustration, and may not be interpreted as limitation to the present application. A further description of the technical schemes of the present application combined with the embodiments and the accompanying drawings is given below. In the description of the embodiments of the present application, it is understood that, when an element is stated to be "above" or "below" another element, unless specifically defined, the element may be "directly" located "above" or "below" the other element (they directly contacts each other), or the element may also be "indirectly" located "above" or "below" the other element (there is a further element between them). For the sake of convenience or clarity, the thickness and the dimension of each element shown in the accompanying drawings may be enlarged, shrunk, or schematically depicted, and the dimension of the elements do not represent the real dimension.

At present, the light extraction efficiency of LED chips is the main factor limiting the external quantum efficiency of LEDs. The main reason for the low light extraction efficiency is the large refractive index difference between a substrate, an epitaxial layer and air. As for the light emitted by an active layer of the LEDs, only a small portion of the light whose reflection angle is less than the total reflection angle may be emitted out, and most of the light may not be emitted out, which is finally absorbed by the materials. At present, the methods to resolve the problems mainly include Patterned Sapphire Substrate (PSS) technologies, surface roughening technologies, sidewall etching technologies and so on, such as dry etching, wet etching, photonic crystal structure, and patterned substrate and the like. In the above methods, by changing the geometry of the contact surface between the substrate and the epitaxial layer, the epitaxial layer and the air, or the substrate and the air, the reflection direction of the light is changed, which deviates the reflection angle of the light from the total reflection angle, and thus the light extraction efficiency is improved.

The surface roughening technology is a technology for changing the geometry of the contact surface between the epitaxial layer and the air. The Chinese Patent Publication CN102130223B entitled "Method for roughening surface of GaN-based LED epitaxial wafer" provides a surface roughening method for the GaN-based LED epitaxial wafer. In the method, after preparing the epitaxial wafer by using the Metal Organic Chemical Vapor Deposition (MOCVD), the wet etching is performed on the epitaxial structure by using Hydrofluoric (HF) acid solution, so that the surface of the GaN-based epitaxial layer is roughened. This application is incorporated herein by reference in its entirety. In the method, the roughened surface of the GaN-based LED epitaxial wafer is obtained by the combination of changing the epitaxial growth conditions and Photoelectrochemical (PEC) etching. Although the light extraction efficiency is improved, the process is more complicated, and at least two different process conditions, such as the MOCVD and the wet etching, are required. In addition, other documents record that the photonic crystal and other processes are used for roughening the surface, which is helpful to realize the improvement of the light extraction efficiency.

In addition to the above Chinese patent, the US Patent Publication US 2011/0156000 A1 entitled "Method of manufacturing a semiconductor device and semiconductor device" and the U.S. Pat. No. 7,071,494 B2 entitled "Light emitting device with enhanced optical scattering" may also be referred. The above applications are incorporated herein by reference in their entireties.

Whether it is the wet etching or the photonic crystal, etc., the essence is to perform additional processing by using a process different from the growth process after the epitaxial growth, and thus the purposes for roughening the surface is achieved.

Therefore, it is hoped that an epitaxial growth method for roughening the surface may be provided, which may improve the light extraction efficiency of LED devices while eliminating the additional processes, such as the wet etching, the photonic crystal and the like.

FIG. 1 is a schematic diagram of a surface roughening method according to an embodiment of the present application.

Figure 2:
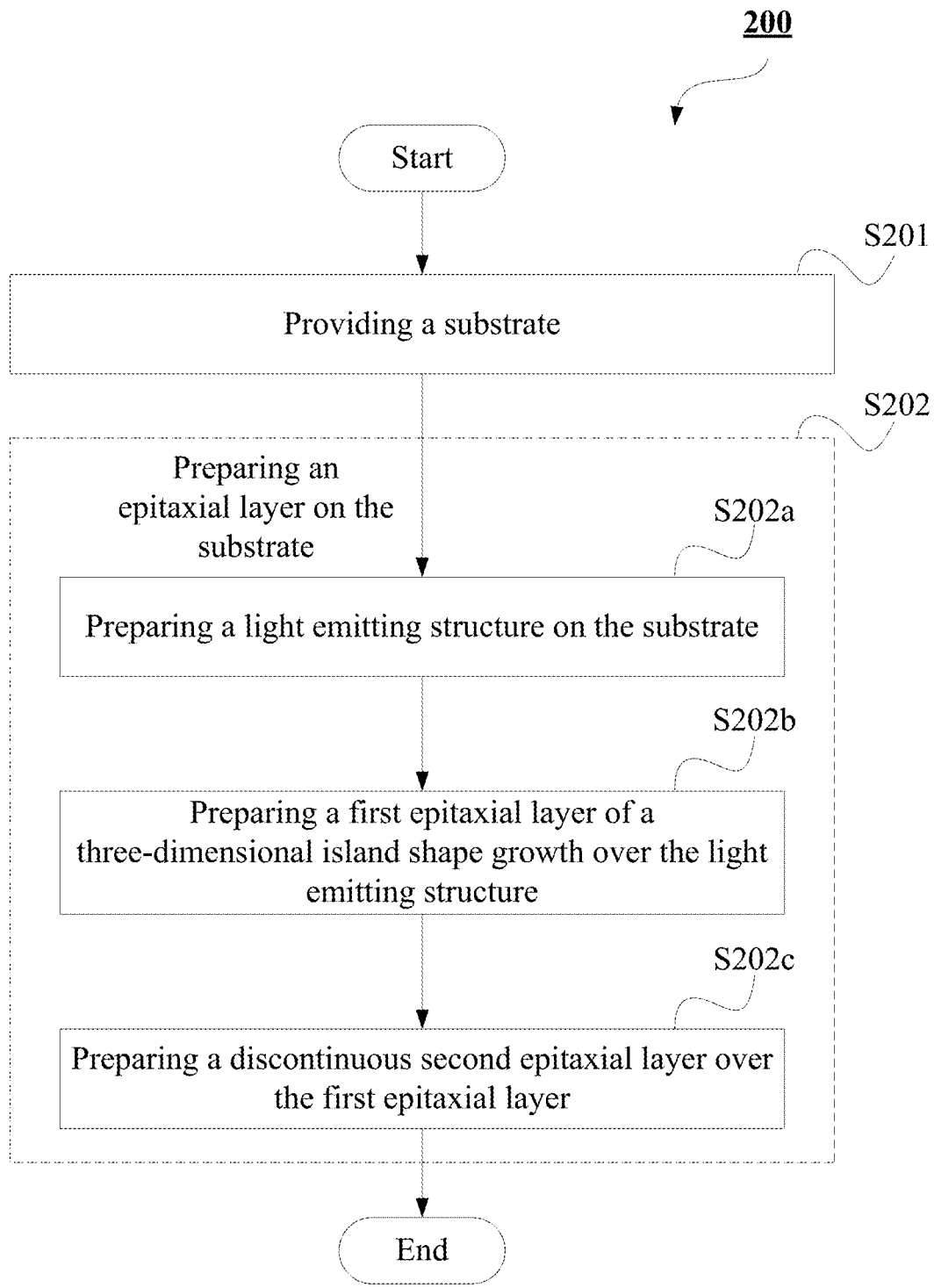
FIG. 2 is a flowchart of a surface roughening method according to an embodiment of the present application.

FIG. 2 is a flowchart of a surface roughening method according to an embodiment of the present application. The method 200 describes a usual method, so more generic concept is used. As shown in FIG. 2, the surface roughening method 200 according to the present application starts from step S201, in which a substrate is provided.

Next, in step S202, an epitaxial layer is prepared on the substrate. Thin films grown on the substrate are all called the epitaxial layer herein. Preferably, the method for preparing the epitaxial layer may be that the epitaxial layer is grown by a Metal Organic Chemical Vapor Deposition (MOCVD) process. Of course, the present application is not limited to the above processes, and the preparation process may also be, for example, Atomic Layer Deposition (ALD), Molecular Beam Epitaxy (MBE), etc.

The step S202 may further include step S202a, step S202b, and step S202c.

First, in the step S202a, a light emitting structure is prepared on the substrate. Referring to step (a) in FIG. 1, the light emitting structure 2 is prepared on the substrate 1. The substrate 1 may be made of, for example, sapphire, SiC, GaN, Si, etc., and the material of the substrate 1 is not particularly limited in the present application. The light emitting structure 2 may be, for example, a basic structure of a light emitting diode in conformity with the light-emitting principle, which includes an n-type semiconductor layer 201, an active layer 202 and a p-type semiconductor layer 203 from the substrate upward sequentially. The active layer may be, for example, a quantum well structure. The active layer may be, for example, a quantum well structure. The specific embodiment of the light emitting structure 2 may not be particularly limited in the present application as long as it is in conformity with the light-emitting principle.

In addition, those skilled in the art should understand that in order to improve the growth quality of the epitaxial layer, other semiconductor layers may be provided between the n-type semiconductor layer and the substrate. Taking a GaN-based LED device on a silicon substrate as an example, on the silicon substrate, an AlN nucleation layer may be grown first, then a buffer layer of AlGaN or other materials may be grown, and then the light emitting structure is grown. Those skilled in the art should know that the GaN-based LED is the LED made with the GaN-based material as the main material, and of course, other doped elements or other kinds of materials are not excluded. The GaN-based material is the material based on GaN, such as GaN, InGaN, AlGaN, AlInGaN and the like.

In the step S202b, a first epitaxial layer grown in a three-dimensional island shape is prepared over the light emitting structure. Referring to step (b) in FIG. 1, the first epitaxial layer 301 is grown over the light emitting structure 2. In the present application, the first epitaxial layer 301 is grown in the three-dimensional island shape. A three-dimensional island shape mode described in the present application is that when a lattice mismatch between two materials is large enough (preferably, when the lattice mismatch between two materials is more than 4%), one material may be grown in the three-dimensional island shape on another material. In the step (b) shown in FIG. 1, a plurality of gaps are formed between the first epitaxial layer 301, so that the first epitaxial layer 301 is divided into a plurality of divided sections in a lateral direction (in a direction perpendicular to the growth direction), thus forming a discontinuous shape like a plurality of isolated islands. Those skilled in the art should understand that the growth morphology of the three-dimensional island shape is not limited to that given in the accompanying drawings of the present application. The gaps between the first epitaxial layer 301 may be large or small, and the size of two random gaps may be equal or unequal.

The divided sections of first epitaxial layers 301 may be large or small, and the size of two random divided sections may be equal or unequal.

In order to make the first epitaxial layer 301 grow in the three-dimensional island shape, the material of the first epitaxial layer 301 may be determined according to the semiconductor material which is directly in contact with the first epitaxial layer 301 and under the first epitaxial layer 301. When the material of the first epitaxial layer 301 and the semiconductor material are different and the lattice mismatch is large, the first epitaxial layer 301 is grown in the three-dimensional island shape. In addition, the thickness of the first epitaxial layer 301 is preferably less than 50 nm to obtain a better growth effect of the three-dimensional island shape.

A preferable embodiment of the GaN-based LED device may be described below. The n-type semiconductor layer 201 is made of n-type GaN, the active layer 202 is a quantum well structure of InGaN/GaN, and the p-type semiconductor layer 203 is made of p-type GaN. The first epitaxial layer 301 may preferably select the material different from GaN, such as AlN, and the thickness of the first epitaxial layer 301 does not exceed 50 nm. In this way, the grown AlN cannot completely heal, thus ensuring that the first epitaxial layer 301 is grown in the three-dimensional island shape. In the step (b) shown in FIG. 1, the thickness of AlN in the embodiment is preferably less than 20 nm to obtain a better growth effect of the three-dimensional island shape. The material of the first epitaxial layer 301 may be other non-GaN III-V semiconductor materials, and preferably III nitride semiconductor materials.

In step S202c, a discontinuous second epitaxial layer is prepared over the first epitaxial layer. Referring to step (c) in FIG. 1, the second epitaxial layer 302 is grown continuously over the first epitaxial layer 301. The material of the second epitaxial layer 302 is different from the material of the first epitaxial layer 301, and the thickness of the second epitaxial layer 302 is less than the thickness of the first epitaxial layer 301, so that the second epitaxial layer 302 shows a discontinuous shape in the lateral direction (in a direction perpendicular to the growth direction) in FIG. 1. In addition, the second epitaxial layer 302 and the first epitaxial layer 301 are preferably grown by a same process, for example, both of which are realized by the MOCVD process, so that the second epitaxial layer 302 and the first epitaxial layer 301 may be grown in a same equipment.

In the present application, the discontinuous second epitaxial layer is regrown over the first epitaxial layer of the three-dimensional island shape growth. In this way, it may be avoided that if only the first epitaxial layer of the three-dimensional island shape growth is grown, a height difference between the highest point and the lowest point on a surface of the first epitaxial layer may not be enough, the surface roughening effect is not good enough, and the light extraction efficiency may not be improved. The regrown discontinuous second epitaxial layer may further improve the surface roughening degree and effectively improve the roughening effect.

A preferable embodiment of the GaN-based LED device may be described below. When the first epitaxial layer 301 is made of AlN, the second epitaxial layer 302 may be preferably made of GaN, and the thickness of the second epitaxial layer 302 is less than the thickness of the first epitaxial layer 301. In the step (c) shown in FIG. 1, the second epitaxial layer 302 also presents the discontinuous shape in the lateral direction (in a direction perpendicular to the growth direction). In addition, in the embodiment, it is preferable to continuously grow AlN and GaN by using a same process (the MOCVD process) in a same equipment (for example, MOCVD equipment), so that the process flow may be simplified. The $H_2$, $N_2$, $NH_3$, HCl or its mixed gas in the equipment (for example, the MOCVD equipment) may have a certain etching effect on the second epitaxial layer 302, and thus the second epitaxial layer 302 has a better roughened surface.

Figure 3A:
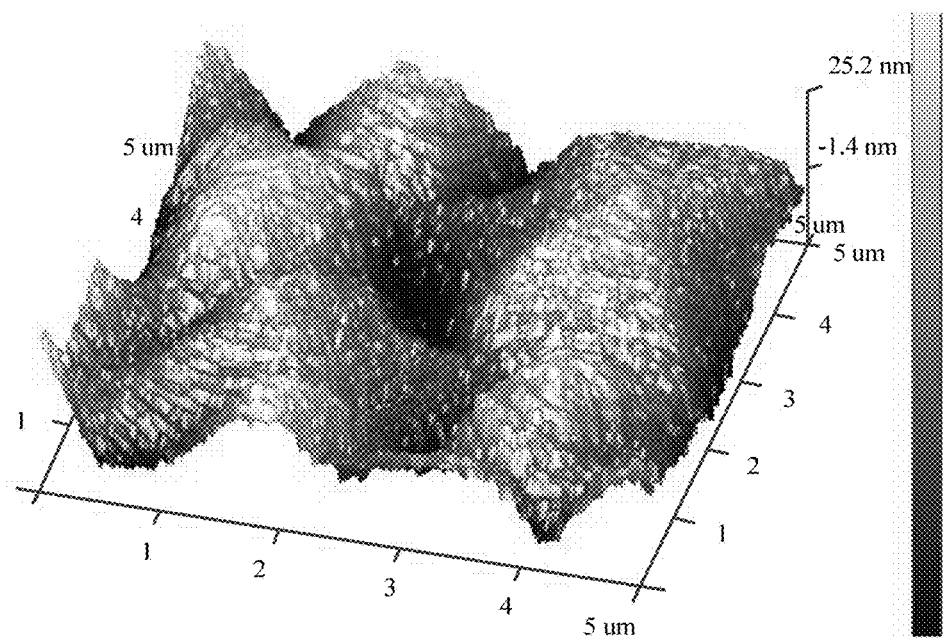
FIG. 3A and FIG. 3B illustrate growth morphologies of AlN thin film and GaN thin film observed under an atomic force microscope according to an embodiment.
Figure 3B:
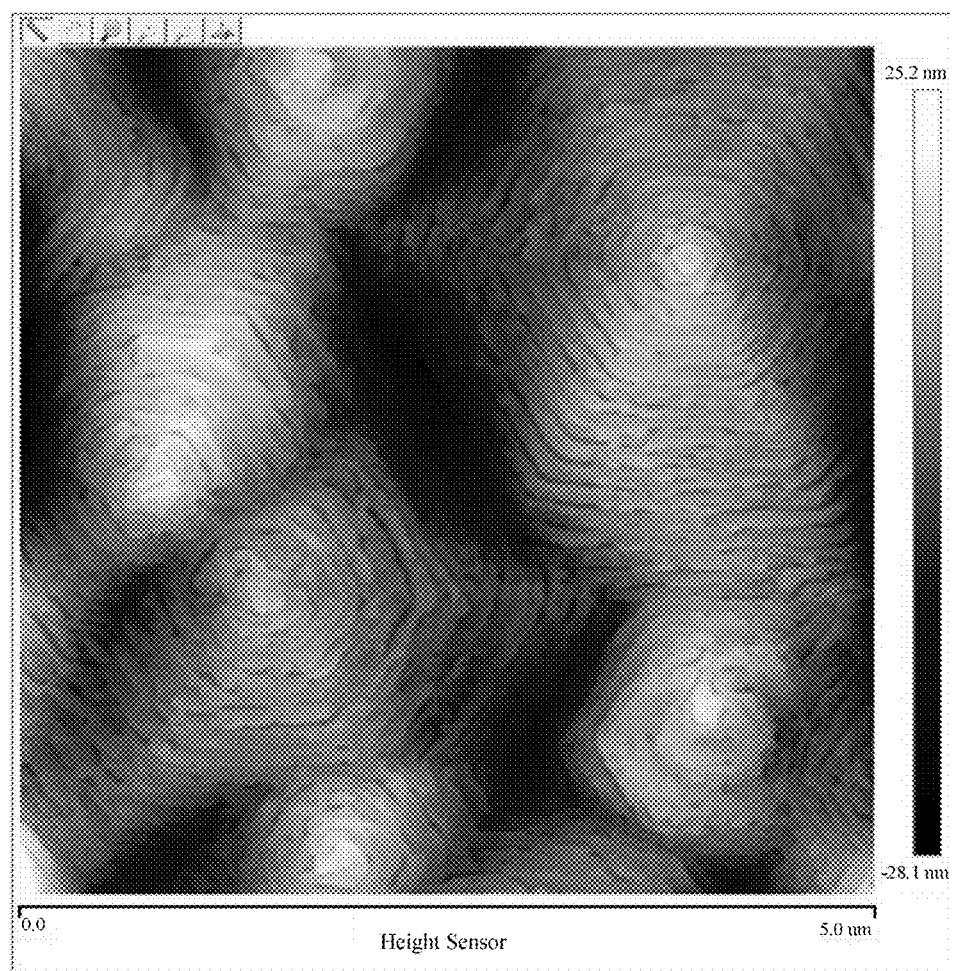

FIG. 3A and FIG. 3B illustrate growth morphologies of AlN thin film and GaN thin film observed under an atomic force microscope according to an embodiment. FIG. 3A illustrates a growth stereo-morphology of the AlN thin film and the GaN thin film observed under the atomic force microscope according to an embodiment; and FIG. 3B illustrates a growth overlook morphology of the AlN thin film and the GaN thin film observed under the atomic force microscope according to an embodiment. FIG. 3A and FIG. 3B illustrate morphologies of epitaxial growth in an environment with high $H_2$ content and low $NH_3$ content.

Referring to step (d) in FIG. 1 continuously, a roughened structure 303 may be a structure with a roughened surface obtained after preforming the step S202b (the step (b) in FIG. 1) and the step S202c (the step (c) in FIG. 1) one time.

In another embodiment of the present application, the step S202b (the step (b) in FIG. 1) and the step S202c (the step (c) in FIG. 1) may be repeated a plurality of times, so that the roughened structure 303 thus obtained may have a better roughening effect.

Figure 4A:
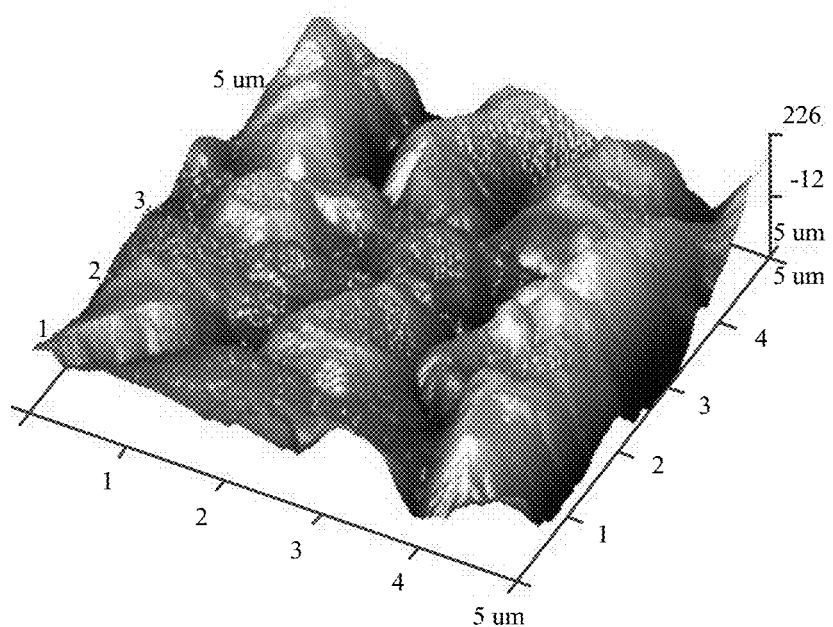
FIG. 4A and FIG. 4B illustrate morphologies of AlN and GaN grown a plurality of pairs observed under an atomic force microscope and a usual microscope according to an embodiment.
Figure 4B:
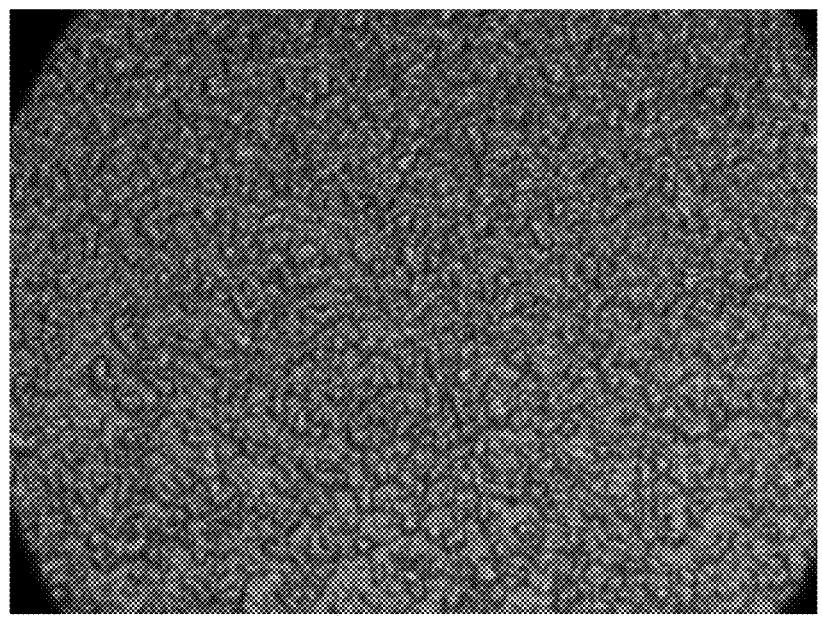

FIG. 4A and FIG. 4B illustrate morphologies of AlN and GaN grown a plurality of pairs observed under an atomic force microscope and a usual microscope according to an embodiment. FIG. 4A illustrates a stereo-morphology of the AlN and the GaN grown the plurality of pairs observed under the atomic force microscope according to an embodiment. FIG. 4B illustrates a overlook morphology of the AlN and the GaN grown the plurality of pairs observed under the usual microscope (the optical or electron microscope) according to an embodiment.

Those skilled in the art should understand that although in the above embodiments, it is described that the epitaxial layer is grown over the LED structure to form the epitaxial layer with a roughened surface. However, this technique is also generally applicable to roughen the surface of the epitaxial layer of a product.

In addition, according to the actual product requirements, the choice of the materials of the epitaxial layer may also be more diversified. Although AlN and GaN are used in the embodiments of the present application, other III nitrides, such as AlGaN or AlInGaN, may also be considered, and even broader III-V semiconductor materials may be considered.

Those skilled in the art should realize that the present application also relates to a light emitting device corresponding to the above methods. As shown in the step (d) of FIG. 1, the light emitting device includes: a substrate 1, a light emitting structure 2, a first epitaxial layer 301 of a three-dimensional island shape growth over the light emitting structure and a discontinuous second epitaxial layer 302 over the first epitaxial layer 301. The light emitting structure 2 may include an n-type semiconductor layer 201, an active layer 202, and a p-type semiconductor layer 203. In order to make the first epitaxial layer 301 grown in the three-dimensional island shape, the material of the first epitaxial layer 301 is different from the material of the p-type semiconductor layer 203 in direct contact with the first epitaxial layer 301, and the lattice mismatch is large enough. In addition, the thickness of the first epitaxial layer 301 is preferably less than 50 nm. In order to ensure that the second epitaxial layer 302 grows discontinuously over the first epitaxial layer 301, the material of the second epitaxial layer 302 is different from the material of the first epitaxial layer 301, and the thickness of the second epitaxial layer 302 is preferably less than the thickness of the first epitaxial layer 301. The first epitaxial layer 301 and the second epitaxial layer 302 may be prepared repeatedly for a plurality of times to reach a better roughening effect.

Taking the light emitting device preferably as the GaN-based material as an example, the n-type semiconductor layer 201 is made of n-type GaN, the active layer 202 is a quantum well structure of InGaN/GaN, the p-type semiconductor layer 203 is made of p-type GaN, the first epitaxial layer 301 is made of AlN, and the second epitaxial layer 302 is made of GaN.

In the method for roughening the surface of the light emitting device and the light emitting device, in addition to the epitaxial growth process, it is not necessary to use an additional process such as wet etching, photonic crystal and other processes to further process the surface of the epitaxial layer, and the method may be implemented by means of one process in a same reaction equipment. The method is simple and convenient, and avoids the pollution caused by, for example, etching process to the epitaxial layer. In addition, the roughened surface formed in this way also has a certain improvement in the roughening effect compared with the traditional process, which may play a role in improving the light extraction efficiency of the LED structure. It can be seen from FIG. 3A, FIG. 3B, FIG. 4A, and FIG. 4B that a required uneven roughened surface may be formed by the epitaxial growth method of the present application, thus improving the light extraction efficiency of the LED structure.

Various embodiments and implementation scenarios of the present application have been described above. However, the spirit and scope of the present application are not limited to this. Those skilled in the art will be able to make more applications according to the teachings of the present application, all of which are within the scope of the present application.

That is to say, the above embodiments of the present application are merely examples to clearly explain the present application, rather than limiting the implementation manners of the present application. As for those skilled in the art, based on the above description, other different changes or alterations may be made. It's not necessary or possible to exhaust all implementations herein. Any modifications, equivalent substitutions, improvements, etc., made within the spirit and principle of the present application should be included within the scope of the present application.

What is claimed is:

1. A surface roughening method for a light emitting device, comprising the following steps:
   (a) preparing a first epitaxial layer of a three-dimensional island shape growth over a light emitting structure; and
   (b) preparing a discontinuous second epitaxial layer over the first epitaxial layer,
   wherein a material of the first epitaxial layer is different from a material of the light emitting structure in direct contact with the first epitaxial layer, and a material of the second epitaxial layer is different from the material of the first epitaxial layer;
   wherein the light emitting structure is made of a GaN-based material, the first epitaxial layer is made of AlN, and the second epitaxial layer is made of GaN.

2. The method of claim 1, wherein the light emitting structure comprises an n-type semiconductor layer, an active layer and a p-type semiconductor layer.

3. The method of claim 2, wherein the n-type semiconductor layer is made of n-type GaN, the active layer is a quantum well structure of InGaN/GaN, and the p-type semiconductor layer is made of p-type GaN.

4. The method of claim 1, wherein the GaN-based material is selected from one or more of the following: GaN, InGaN, AlGaN, and AlINGaN.

5. The method of claim 1, wherein a thickness of the first epitaxial layer is less than 50 nm.

6. The method of claim 1, wherein a thickness of the second epitaxial layer is less than a thickness of the first epitaxial layer.

7. The method of claim 1, wherein the step (a) and the step (b) are repeated a plurality of times sequentially.

8. The method of claim 1, wherein the step (a) and the step (b) are implemented by a metal organic chemical vapor deposition process.

9. A light emitting device, comprising:
   a light emitting structure;
   a first epitaxial layer of a three-dimensional island shape growth over the light emitting structure; and
   a discontinuous second epitaxial layer over the first epitaxial layer,
   wherein a material of the first epitaxial layer is different from a material of the light emitting structure in direct contact with the first epitaxial layer, and a material of the second epitaxial layer is different from the material of the first epitaxial layer;
   wherein the light emitting structure is made of a GaN-based material, the first epitaxial layer is made of AlN, and the second epitaxial layer is made of GaN.

10. The light emitting device of claim 9, wherein the light emitting structure comprises an n-type semiconductor layer, an active layer and a p-type semiconductor layer.

11. The light emitting device of claim 10, wherein the n-type semiconductor layer is made of n-type GaN, the active layer is a quantum well structure of InGaN/GaN, and the p-type semiconductor layer is made of p-type GaN.

12. The light emitting device of claim 9, wherein a thickness of the first epitaxial layer is less than 50 nm.

13. The light emitting device of claim 9, wherein a thickness of the second epitaxial layer is less than a thickness of the first epitaxial layer.

14. The light emitting device of claim 9, wherein the first epitaxial layer and the second epitaxial layer are prepared repeatedly for a plurality of times.

15. The method of claim 1, wherein a lattice mismatch between the first epitaxial layer and the light emitting structure in direct contact with the first epitaxial layer is more than 4%.

16. The light emitting device of claim 9, wherein a lattice mismatch between the first epitaxial layer and the light emitting structure in direct contact with the first epitaxial layer is more than 4%.

* * * * *